United States Patent
Ozcan et al.

(10) Patent No.: US 9,608,080 B2
(45) Date of Patent: Mar. 28, 2017

(54) METHOD AND STRUCTURE TO REDUCE PARASITIC CAPACITANCE IN RAISED SOURCE/DRAIN SILICON-ON-INSULATOR DEVICES

(71) Applicants: International Business Machines Corporation, Armonk, NY (US); STMicroelectronics (Crolles 2) SAS, Crolles (FR)

(72) Inventors: Ahmet S. Ozcan, Grenoble (FR); Emmanuel Petitprez, Grenoble (FR)

(73) Assignees: International Business Machines Corporation, Armonk, NY (US); STMICROELECTRONICS (CROLLES 2) SAS, Crolles (FR)

( * ) Notice: Subject to any disclaimer, the term of this patent is extended or adjusted under 35 U.S.C. 154(b) by 14 days.

(21) Appl. No.: 14/639,232

(22) Filed: Mar. 5, 2015

(65) Prior Publication Data

US 2016/0260811 A1   Sep. 8, 2016

(51) Int. Cl.
| | |
|---|---|
| *H01L 29/417* | (2006.01) |
| *H01L 29/16* | (2006.01) |
| *H01L 29/06* | (2006.01) |
| *H01L 29/423* | (2006.01) |
| *H01L 29/51* | (2006.01) |
| *H01L 29/78* | (2006.01) |
| *H01L 29/66* | (2006.01) |

(52) U.S. Cl.
CPC .... *H01L 29/41783* (2013.01); *H01L 29/0649* (2013.01); *H01L 29/16* (2013.01); *H01L 29/42364* (2013.01); *H01L 29/51* (2013.01); *H01L 29/518* (2013.01); *H01L 29/6653* (2013.01); *H01L 29/66628* (2013.01); *H01L 29/7838* (2013.01); *H01L 29/665* (2013.01)

(58) Field of Classification Search
CPC .............. H01L 29/41783; H01L 29/42364
USPC .......................................... 257/348
See application file for complete search history.

(56) References Cited

U.S. PATENT DOCUMENTS

| | | | |
|---|---|---|---|
| 6,815,329 B2 * | 11/2004 | Babich | H01L 21/7681 257/E21.579 |
| 8,124,525 B1 | 2/2012 | Koburger, III et al. | |
| 8,624,329 B2 | 1/2014 | Lee et al. | |
| 8,637,941 B2 | 1/2014 | Li et al. | |
| 2005/0260801 A1 * | 11/2005 | Divakaruni | H01L 29/458 438/151 |
| 2013/0187229 A1 * | 7/2013 | Cheng | H01L 29/772 257/347 |

* cited by examiner

*Primary Examiner* — Kenneth Parker
*Assistant Examiner* — Warren H Kilpatrick
(74) *Attorney, Agent, or Firm* — Steven J. Meyers; Hoffman Warnick LLC

(57) ABSTRACT

An aspect of the invention is directed to a silicon-on-insulator device including a silicon layer on an insulating layer on a substrate; a raised source and a raised drain on the silicon layer; a gate between the raised source and the raised drain; a first spacer separating the gate from the raised source and substantially covering a first sidewall of the gate; a second spacer separating the gate from the raised drain and substantially covering a second sidewall of the gate; and a low-k layer over the raised source, the raised drain, the gate and each of the first spacer and the second spacer; and a dielectric layer over the low-k layer.

20 Claims, 9 Drawing Sheets

METHOD AND STRUCTURE TO REDUCE PARASITIC CAPACITANCE IN RAISED SOURCE/DRAIN SILICON-ON-INSULATOR DEVICES

BACKGROUND

The present invention relates to a semiconductor structure with a reduced parasitic capacitance, and more specifically, to a silicon-on-insulator device with a raised source and drain, and a method of making the same.

Parasitic capacitance refers to the undesirable capacitance that exists between parts of a semiconductor device due to the proximity of the parts to each other. All integrated circuit elements (i.e., inductors, diodes, transistors, etc.) have internal capacitance. For example, in a transistor, parasitic capacitance refers to the undesirable capacitance that exists between the source, drain, and gate. Typically, parasitic capacitance can be ignored at low frequencies, but at high frequencies parasitic capacitance can become a problem. For example, at high frequencies, parasitic capacitance between the output and input of a device can act as a feedback path and cause the circuit to oscillate.

A transistor with a raised source/drain is a transistor in which the source and drain are in a layer above the channel region. In a conventional transistor, the channel region is positioned between the source and drain. To reduce parasitic capacitance in a raised source/drain transistor, the distance between each of the raised source and drain to the gate is decreased. However, as the raised source and drain move closer to the gate, the resistance in the source and drain extension regions under the gate spacer increases.

SUMMARY

A first aspect of the invention is directed to a silicon-on-insulator device comprising: a silicon layer on an insulating layer on a substrate; a raised source and a raised drain on the silicon layer; a gate between the raised source and the raised drain; a first spacer separating the gate from the raised source and substantially covering a first sidewall of the gate; a second spacer separating the gate from the raised drain and substantially covering a second sidewall of the gate; and a low-k layer over the raised source, the raised drain, the gate and each of the first spacer and the second spacer; and a dielectric layer over the low-k layer.

A second aspect of the invention is directed to a fully-depleted silicon-on-insulator (FDSOI) device comprising: a silicon layer on an insulating layer on a substrate; a raised source and a raised drain on the silicon layer; a gate between the raised source and the raised drain, the gate being over the silicon layer and including a gate dielectric between the gate and the silicon layer; a set of silicide contacts having a first silicide contact on the raised source, a second silicide contact on the raised drain, and a third silicide contact on the gate; a pair of spacers having a first spacer separating the gate from the raised source and substantially covering a first sidewall of the gate, and a second spacer separating the gate from the raised drain and substantially covering a second sidewall of the gate, each of the spacers including: a spacer layer on the silicon layer, and a low-k layer on the spacer layer; and a dielectric layer over the low-k layer, wherein the low-k layer extends over each of the silicide contacts on the raised source, the raised drain, and the gate.

A third aspect of the invention is directed to a method for fabricating a semiconductor structure with a reduced parasitic capacitance, the method comprising: forming a semiconductor device including a raised source, a raised drain, a gate, and a pair of spacer areas having a spacer layer therein, the pair of spacer areas substantially separating the gate from the raised source and the raised drain; forming silicide contacts on the raised source, the raised drain, and the gate; removing at least a portion of the spacer layer in each of the spacer areas; depositing a low-k layer over each of the raised source, raised drain, the gate and the spacer areas to reduce the parasitic capacitance of the semiconductor structure; and depositing a dielectric layer over the raised source, the raised drain, and the gate.

BRIEF DESCRIPTION OF THE SEVERAL VIEWS OF THE DRAWINGS

These and other features of the present invention will be more readily understood from the following detailed description of the various aspects of the invention taken in conjunction with the accompanying drawings that depict various embodiments of the invention, in which.

DETAILED DESCRIPTION

Embodiments of the present invention include a raised source/drain semiconductor structure with reduced parasitic capacitance. As will be described herein, the semiconductor structure of embodiments of the present invention utilizes a low-k layer on a raised source and raised drain structure or within spacers adjacent to the raised source and the raised drain to reduce parasitic capacitance of the structure. Additionally, embodiments of the present invention provide a method for fabricating a semiconductor structure having a reduced parasitic capacitance wherein the low-k layer is deposited after the formation of silicide contacts without significantly degrading the silicide contacts.

Conventionally, layers having a higher dielectric constant are used and deposited prior to the formation of silicide contacts. One problem associated with the conventional method is that the high dielectric materials require deposition at high temperatures. Deposition of these materials at high temperatures results in degradation of the silicide contacts. Embodiments of the present invention include depositing materials having a low dielectric constant at low temperatures after the formation of silicide contacts to reduce parasitic capacitance with little or no degradation of the silicide contact.

Figure 2:
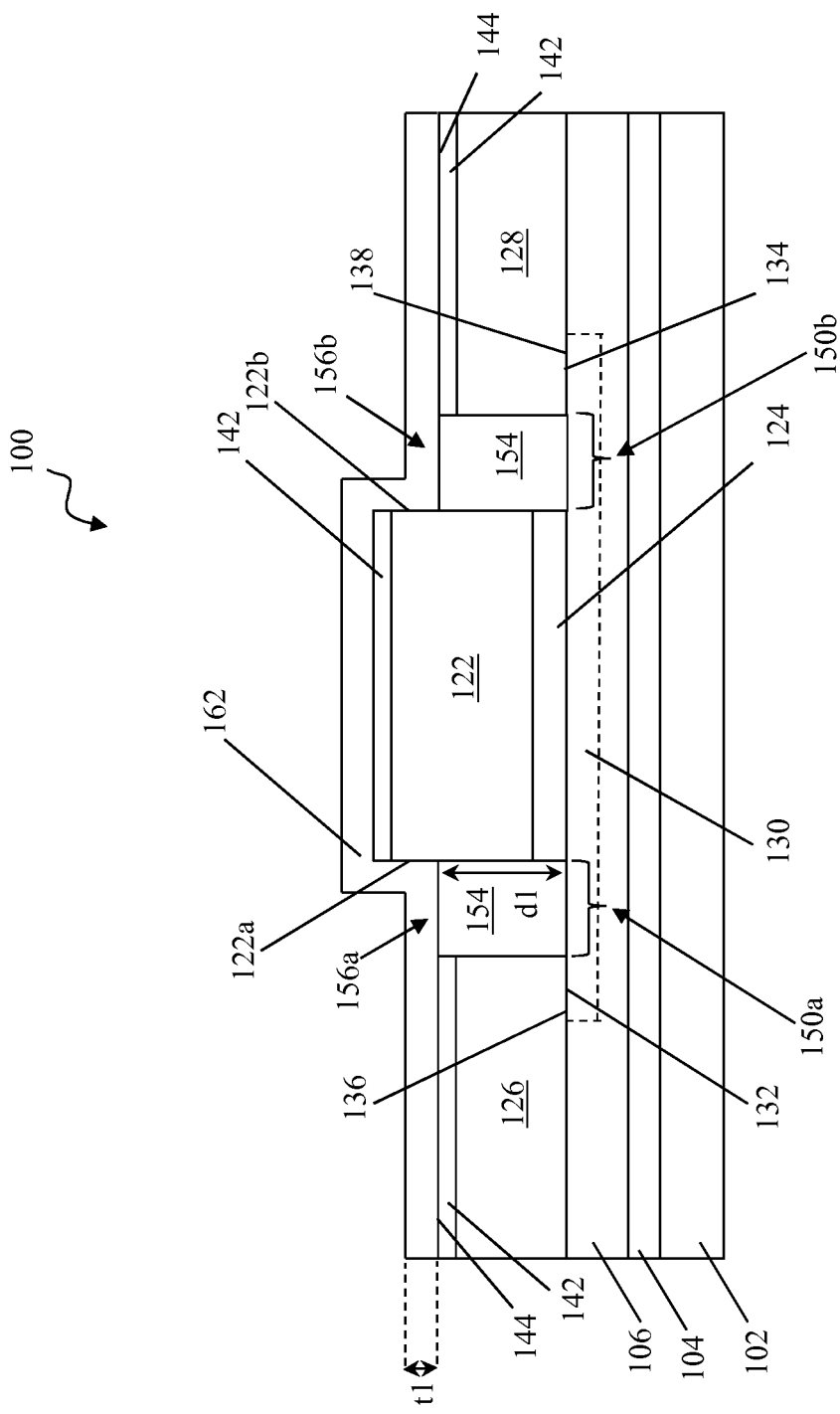
FIG. 2 shows the deposition of a low-k layer on the semiconductor device according to the aspect of the invention shown in FIG. 1.
Figure 3:
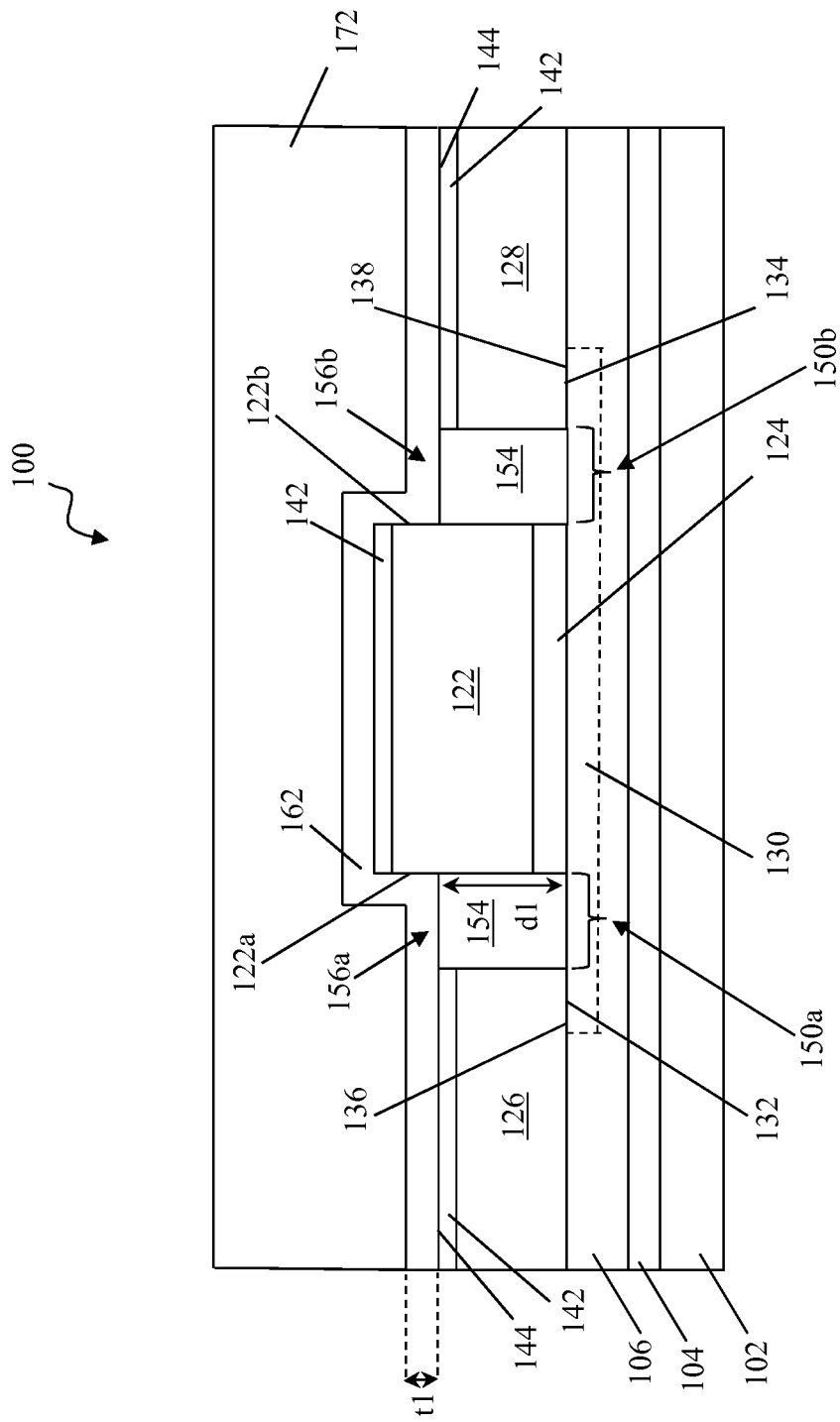
FIG. 3 shows the deposition of a dielectric layer on the semiconductor device according to the aspect of the invention shown in FIG. 2.
Figure 4:
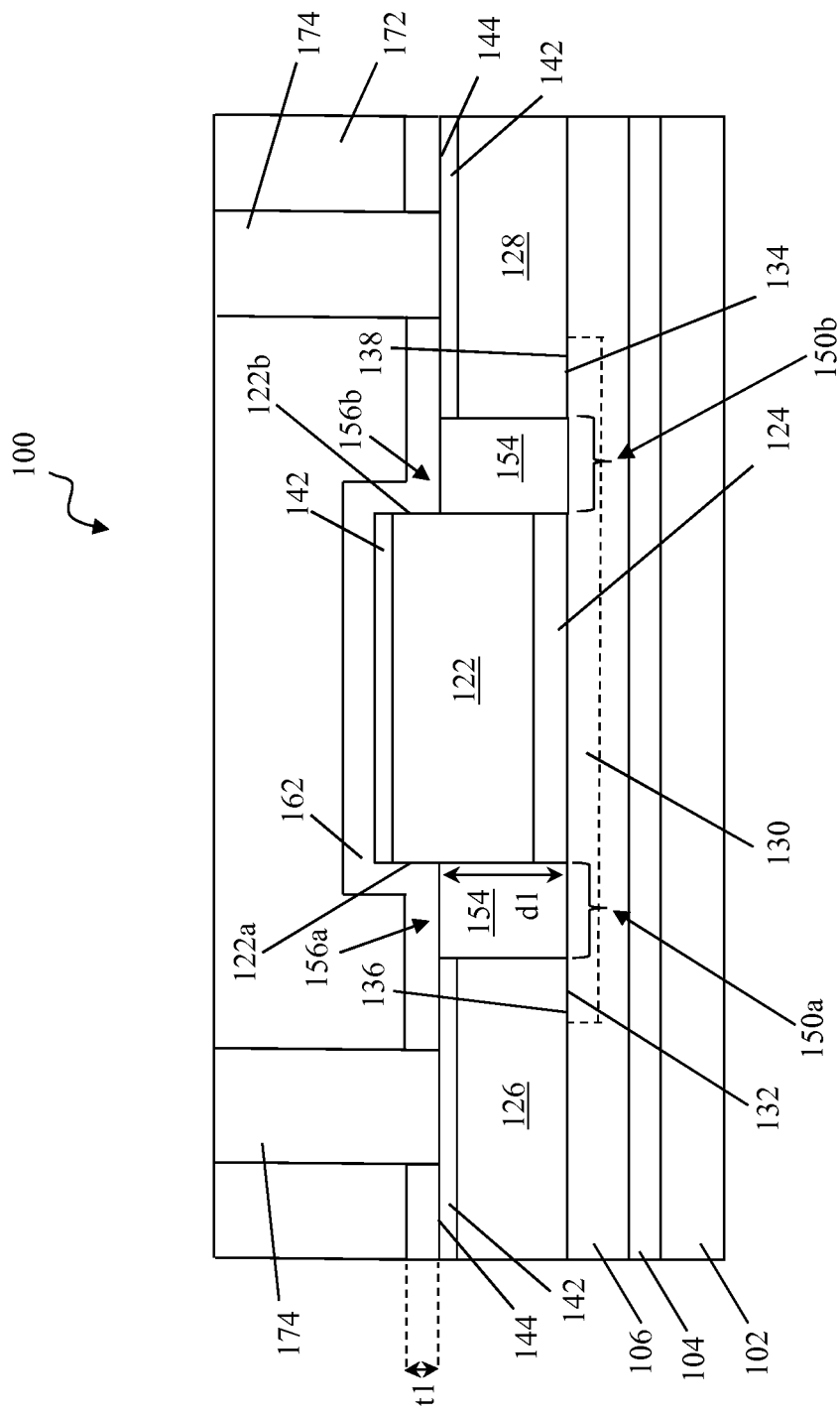
FIG. 4 shows the formation of contacts in the dielectric layer according to an aspect of the invention.

A method according to one embodiment of this invention is shown in FIGS. 1-4, with FIG. 4 showing the final device structure according to this embodiment. The final device structure may include a gate 122, a raised source 126 and a raised drain 128 on a silicon layer 106. A pair of spacers 156a, 156b may be disposed on opposite sides of gate 122 on silicon layer 106. Additionally, silicide contacts 142 may be disposed on each of gate 122, raised source 126, and raised drain 128.

Figure 1:
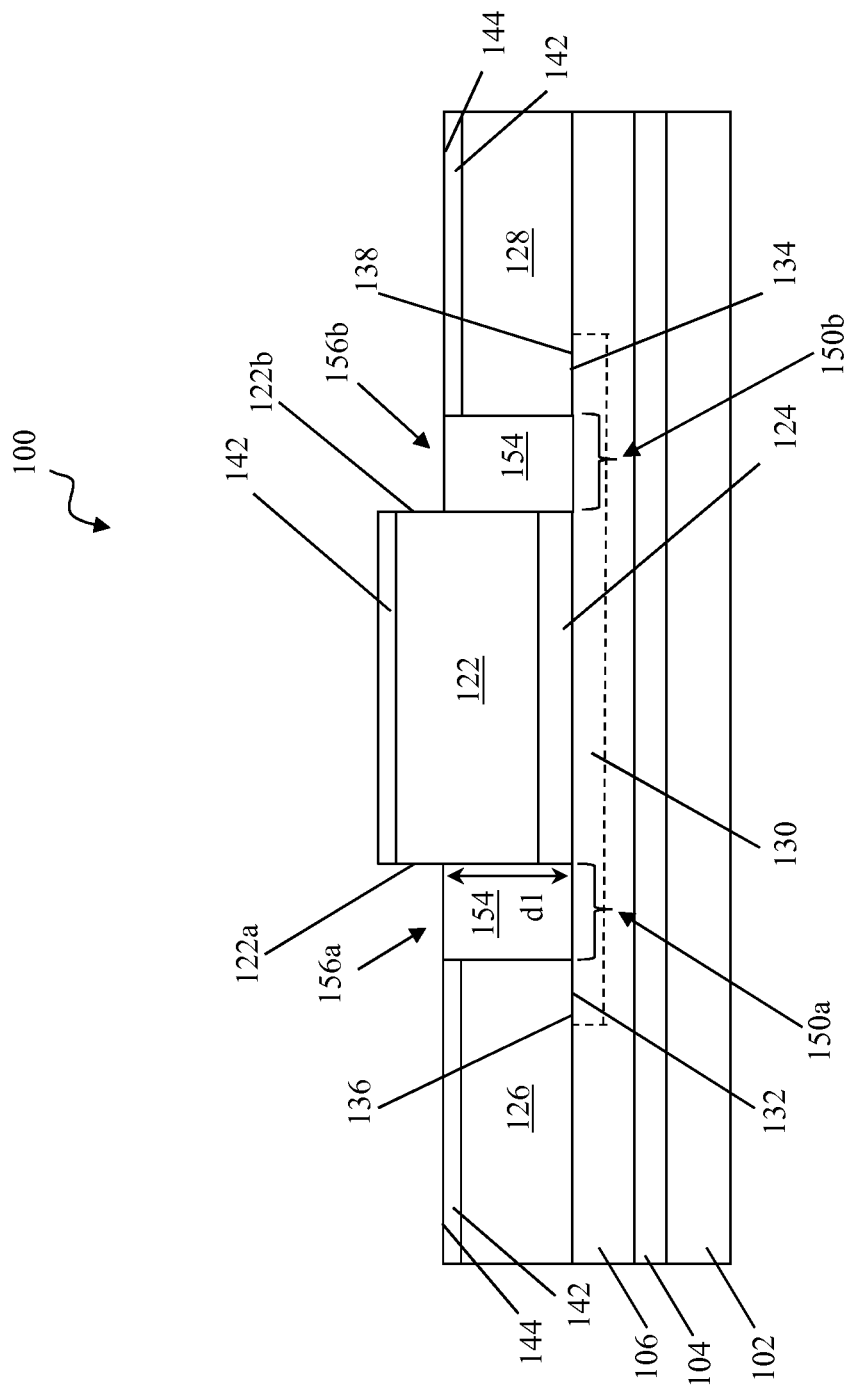
FIG. 1 shows the semiconductor device according to an aspect of the invention.

Turning to FIG. 1, a semiconductor structure 100 is formed. Semiconductor structure 100 can be a metal-oxide-semiconductor field-effect-transistor (MOSFET) such as a fully-depleted silicon-on-insulator (FDSOI) device or a partially-depleted silicon-on-insulator (PDSOI) device. In this embodiment, semiconductor structure 100 may include a substrate 102, an insulating layer 104, and a silicon layer 106. Insulating layer 104 may be deposited on (i.e., in contact with) substrate 102 as known in the art of semiconductor manufacturing. As used herein, "depositing" may include, but is not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Silicon layer 106 may be deposited on (i.e., in contact with) insulating layer 4 such that insulating layer 104 substantially separates silicon layer 106 from substrate 102. As used herein, the term "substantially" refers to largely, for the most part, or entirely specified.

As is understood in the art of semiconductor manufacturing, substrate 102 and silicon layer 106 may include, but are not limited to silicon (Si), germanium (Ge), silicon germanium (SiGe), silicon carbide (SiC), and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate 102 may be strained. Insulating layer 104 may include a nitride, an oxynitride, or other suitable insulating material(s). In one embodiment, insulating layer 104 may include an oxide, such as silicon oxide ($SiO_2$), hafnium oxide ($HfO_2$), zirconium oxide ($ZrO_2$), aluminum oxide ($Al_2O_3$), titanium oxide ($TiO_2$), lanthanum oxide ($La_2O_3$), strontium titanate ($SrTiO_3$), lanthanum aluminate ($LaAlO_3$), and combinations thereof.

A gate 122 may be formed on silicon layer 106. Gate 122 may substantially separate a raised source 126 and a raised drain 128. Gate 122 may include, but is not limited to, poly-silicon, or a metal such as, tungsten (W), aluminum (Al) or combinations thereof or a fully silicided gate (FUSI).

Further, it is to be understood that gate 122 may be a gate stack and include multiple layers. Gate 122 may be directly on (i.e., in contact with) silicon layer 106 (not shown) or may be separated from silicon layer 106 by a gate dielectric layer 124. Gate dielectric 124 may include, but is not limited to, metal oxides, metal oxynitrides, metal silicon oxides, metal silicon oxynitrides, metal germanium oxides, metal germanium oxynitrides, and alloys, mixtures or multilayers of the same, where the metal may be selected from aluminum (Al), barium (Ba), beryllium (Be), bismuth (Bi), carbon (C), calcium (Ca), cerium (Ce), cobalt (Co), chromium (Cr), dysprosium (Dy), europium (Eu), iron (Fe), gallium (Ga), gadolinium (Gd), hafnium (Hf), indium (In), lanthanum (La), lithium (Li), magnesium (Mg), manganese (Mn), molybdenum (Mo), niobium (Nb), nickel (Ni), praseodymium (Pr), scandium (Sc), strontium (Sr), tantalum (Ta), titanium (Ti), vanadium (V), tungsten (W), yttrium (Y), zinc (Zn), and zirconium (Zr). Gate 122 may be formed by depositing gate dielectric 124 on silicon layer 106 and depositing gate 122 material on gate dielectric 124, followed by conventional lithography to pattern gate 122 and gate dielectric 124.

Formation of semiconductor structure 100 may also include depositing a spacer layer 154 in spacer areas 150a, 150b on opposite sides of gate 122 to form a pair of spacers 156a, 156b. Pair of spacers may include a first spacer 156a and a second spacer 156b. First spacer 156a may substantially cover a first sidewall 122a of gate 122. Second spacer 156b may substantially cover a second sidewall 122b of gate 122. Spacer layer 154 may include, but is not limited to, oxides or nitrides such as SiN or $SiO_2$. Spacer layer 154 may also include a multiplicity of layers (not shown for clarity). As will be described herein, excess spacer layer 154 may be etched so that spacers 156a, 156b may extend from silicon layer 106 to a top surface 144 of silicide contacts 142 which will be described herein.

Raised source 126 and raised drain 128 may be formed on silicon layer 106. Raised source 126 may be formed such that raised source 126 is substantially separated from gate 122 by first spacer 156a. Raised drain 128 may be formed such that raised drain 128 is substantially separated from gate 122 by second spacer 156b. Raised source 126 and raised drain 128 may include, but are not limited to, silicon (Si), silicon germanium (SiGe), silicon carbide (SiC) or combinations thereof. Raised source 126 and raised drain 128 may each be formed (e.g., by deposition or epitaxial growth of a semiconducting material) on opposite sides of gate 122. For example, a layer of silicon (Si), germanium (Ge), or combination of silicon (Si) and germanium (Ge) may be deposited, patterned, and etched in any conventional manner known in the art to form the raised source 126 and raised drain 128. As used herein, "etching" can include, but is not limited to, any now known or later developed techniques appropriate for the material to be etched including but not limited to, for example: isotropic etching, anisotropic etching, plasma etching, sputter etching, ion beam etching, reactive-ion beam etching and reactive-ion etching (RIE). Raised source 126 and raised drain 128 are also formed by introducing dopants of a second conductivity type (P or N) into a semiconductor substrate of a first conductivity type (N or P), such as via ion implantation or in-situ during deposition. It is to be understood that raised source 126 and raised drain 128 are not limited to the positions shown in FIG. 1, rather raised source 126 and raised drain 128 may be positioned on either side of gate 122.

It is to be understood that in a FDSOI device, silicon layer 106 acts as a channel region between raised source 126 and raised drain 128. However, in an alternative embodiment, semiconductor structure 100 may be a PDSOI device. In this embodiment, semiconductor structure 100 may also include a channel region 130 embedded in silicon layer 106 as shown by dotted lines in FIG. 1. Channel region 130 may include, but is not limited to, silicon (Si), germanium (Ge), carbon (C), gallium (Ga), arsenic (As), indium (In), aluminum (Al), antimony (Sb), boron (B), and combinations thereof. A first end of a top surface 132 of channel region 130 may contact a bottom surface 136 of raised source 126. A second end of a top surface 134 of channel region 130 may contact a bottom surface 138 of raised drain 128.

A silicide contact 142 may be formed on each of the gate 122, raised source 126, and raised drain 128. Silicide contacts 142 may include, but are not limited to, silicides such as cobalt silicide ($CoSi_2$), titanium silicide ($TiSi_2$), Ni based silicides (e.g., NiSi, NiPtSi) or tungsten silicide (e.g. $WSi_2$). Silicide contacts 142 may be formed by depositing a metal such as, for example, nickel (Ni) nickel platinum (NiPt), colbalt (Co), tungsten (W) and titanium (Ti). Additionally, the metal may undergo a high or low temperature anneal. The formation of the silicide contacts may also include selectively etching the silicide such that only portions of the silicide remain on the raised source, the raised drain, and the gate.

Spacers 156a, 156b may each have depth dl which extends from silicon layer 106 to a top surface 144 of silicide contacts 142 on raised source 126 and raised drain 128. Depth dl of spacers 156a, 156b may be, for example, approximately 1-50 nanometers (nm). As used herein "approximately" is intended to include values, for example, within 10% of the stated values. Spacer layer 154 may be etched so that spacer layer 154 extends from silicon layer 106 to top surface 144 of silicide contacts 142. That is, a substantial portion of spacers 156a, 156b may include spacer layer 154. In one embodiment, spacers 156a, 156b may include up to 98% of spacer layer 154.

As shown in FIG. 2, a low-k layer 162 may be deposited on semiconductor structure 100. Low-k layer 162 may be deposited so that low-k layer 162 substantially covers silicide contacts 142 over gate 122, raised source 126, and raised drain 128. Additionally, low-k layer 162 may be deposited over spacers 156a, 156b such that it contacts spacer layer 154 therein and covers a portion of both first and second sidewalls 122a, 122b of gate 122. Low-k layer 162 may have a thickness t1 that is, for example, approximately 1-20 nm. Low-k layer 162 may include, but is not limited to, SiBCN, SiOCN, SiCO, SiC, SiBN, SiON, or silicon oxide (SiO2). It is to be understood that the possible materials for low-k layer 162 may not be written in their stoichiometric form, rather B, C, and 0 for example, may include varying concentrations which may range from 1-50%. Low-k layer 162 may include any other material having a dielectric constant less than 7. Additionally, it may be understood that in some embodiments, low-k layer 162 may include a material that has a dielectric constant less than the dielectric constant of the material of spacer layer 154. For example, where spacer layer 154 includes SiO2, low-k layer 162 would likely not include SiO2. However, where spacer layer 154 includes SiN, then low-k layer 162 may include SiO2. Due to the lower dielectric constant of the low-k layer 162, the semiconductor structure will have a reduced parasitic capacitance. In a raised source-drain architecture the fringe capacitance (the capacitance between gate 122 and raised source 126 and raised drain 128 regions) will be reduced by lowering the dielectric constant of the material between gate and raised source-drain. Low-k layer 162 may be deposited such that the deposition does not degrade the existing materials, such as gate 122, raised source 126, raised drain 128, or silicide contacts 142. For example, in one embodiment, silicide contacts 142 material can be a silicide, such as Ni based silicides (NiSi, NiPtSi). Here, low-k layer 162 deposition should not be higher than 500° C. In some embodiments, low-k layer 162 deposition is done at, for example, approximately 350-450° C.

As shown in FIG. 3, a dielectric layer 172 may be deposited on semiconductor structure 100 over low-k layer 162. Dielectric layer 172 may include one or more dielectric materials including but not limited to: silicon nitride ($Si_3N_4$), silicon oxide ($SiO_2$), fluorinated SiO2 (FSG), hydrogenated silicon oxycarbide (SiCOH), porous SiCOH, boro-phoso-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or multiple layers thereof.

As shown in FIG. 4, contacts 174 may be formed in dielectric layer 172 as known in the art of semiconductor manufacturing. Contacts 174 may be formed such that contacts 174 contact silicide contacts 142 on gate 122, raised source 126, and raised drain 128. That is, a portion of dielectric layer 172 and low-k layer 162 over gate 122, raised source 126, and raised drain 128 may be etched so that contacts 174 may contact silicide contacts 142 thereunder. Contacts 174 may include, but are not limited to tungsten (W) or copper (Cu), and may include, as known in the art, a refractory metal liner made of, for example, titanium (Ti), titanium alloys or compounds such as Ti/TiN, tungsten (W), titanium tungsten (Ti/W) alloys, or chromium (Cr) or tantalum (Ta) and their alloys or some other suitable material.

Figure 5:
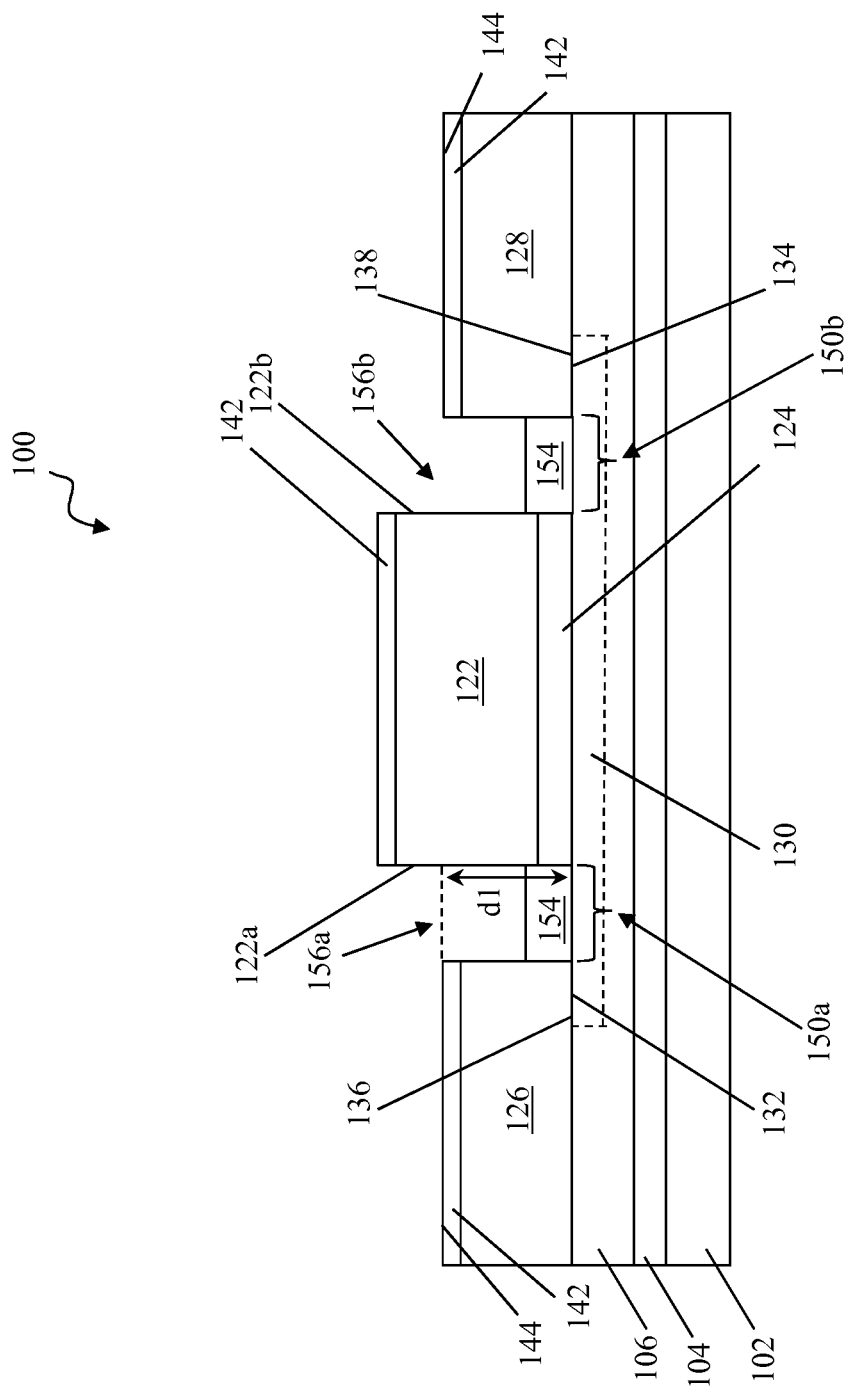
FIG. 5 shows the removal of spacer layer from the spacers according to an aspect of the invention.
Figure 6:
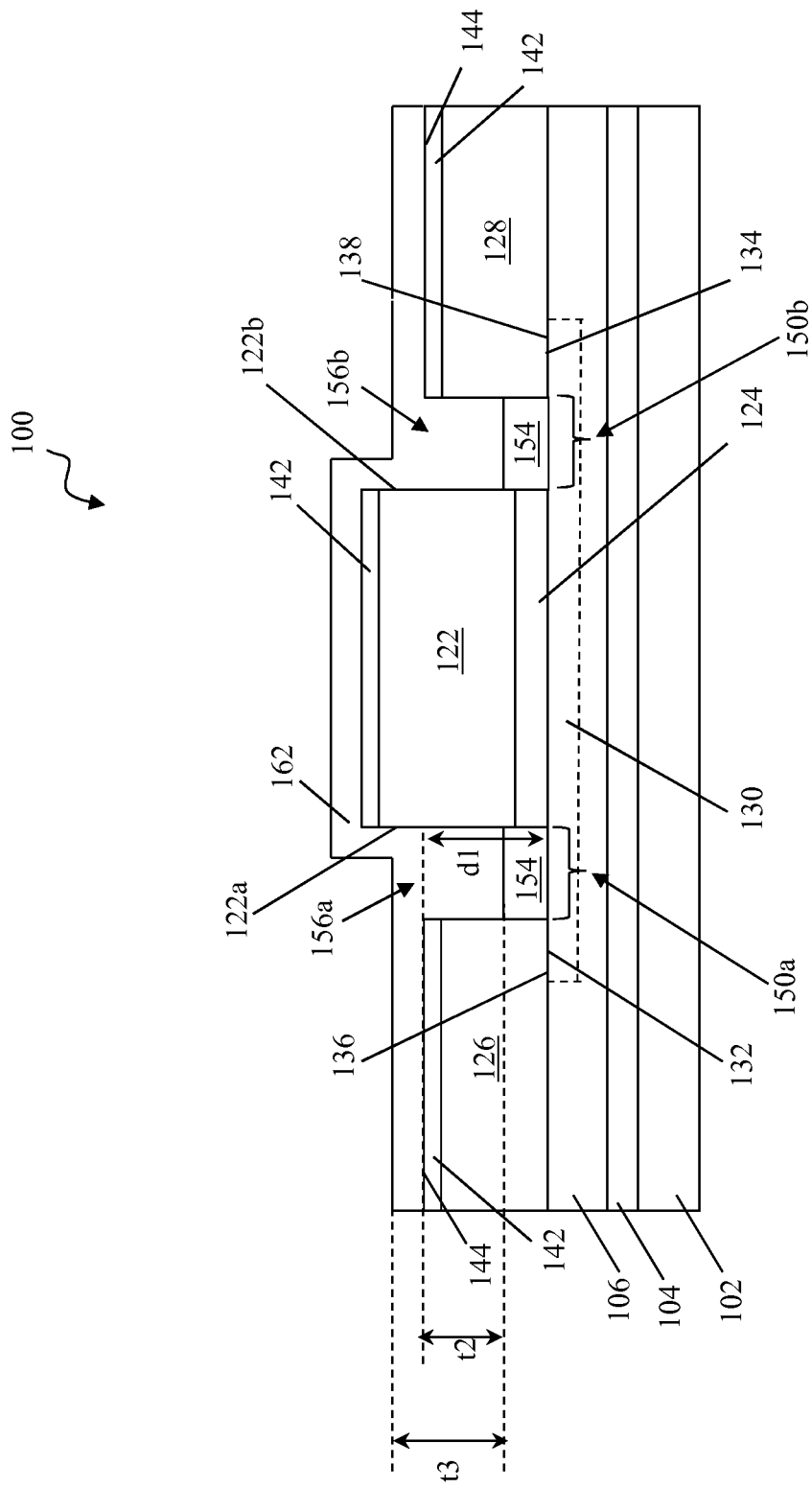
FIG. 6 shows the deposition of a low-k layer on the semiconductor device according to an aspect of the invention.
Figure 7:
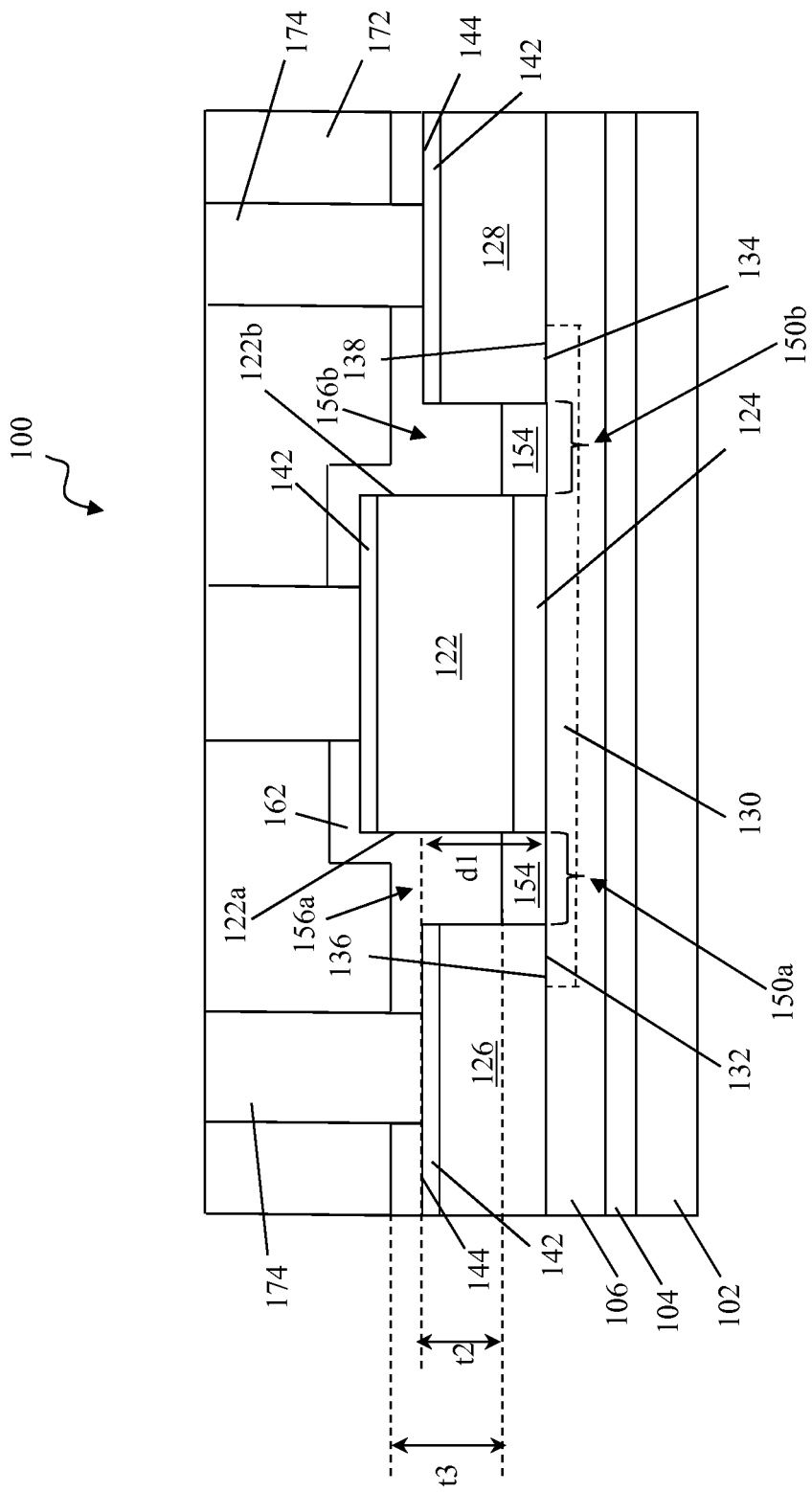
FIG. 7 shows the deposition of a dielectric layer and the formation of contacts within the dielectric layer on the semiconductor device according to the aspect of the invention shown in FIG. 5.

In an additional embodiment, as shown in FIGS. 5-7, a portion of spacer layer 154 may be removed prior to the deposition of low-k layer 162. In this embodiment, spacers 156a, 156b may only partially include spacer layer 154. Alternatively, spacer layer 154 may be completely removed such that spacers 156a, 156b do not include any amount of spacer layer 154 The portion of the spacer layer 154 may be removed by dry or wet etch processes. Dry etch processes can include, for example, RIE, plasma etch or remote plasma etch. Wet etch processes can include, for example, high temperature phosphoric acid ($H_3PO_4$) or hydrogen fluoride (HF) containing chemistries. The etch process must be selective to silicide materials such as nickel silicide (NiSi) or nickel platinum silicide (NiPtSi) or cobalt silicide ($CoSi_2$) or titanium silicide ($TiSi_2$) and silicon (Si), silicon germanium (SiGe), silicon carbide (SiC), titanium nitride (TiN), high-k materials such as hafnium oxide ($HfO_2$) in order to remove the spacer layer 154 efficiently without significantly etching other materials around it. The etch process can remove silicide materials partially (e.g. 10-20% of the liner layer) without departing from aspects of the invention and may even be desired to further reduce parasitic capacitance. The amount of silicide removal will depend on the selectivity of the etch process which can be tuned by varying process conditions. Since the fringe capacitance is inversely proportional to the distance between the gate and the raised source 126 and the raised drain 128, the etch process might be utilized to "trim" (i.e., create facets in) the silicided raised source 126 and raised drain 128.

As shown in FIG. 6, low-k layer 162 may then be deposited on semiconductor structure 100 such that low-k layer 162 substantially covers silicide contacts 142 over gate 122, raised source 126, and raised drain 128 (FIG. 6). Additionally, low-k layer 162 may be deposited over spacers 156a, 156b such that it extends partially within spacer areas 150a, 150b and contacts spacer layer 154 therein. In this embodiment, spacers 156a, 156b may include at least a portion of low-k layer 162. That is, a substantial portion of first and second sidewalls 122a, 122b of gate 122 may be covered by low-k layer 162. In some embodiments, spacers 156a, 156b may substantially include low-k layer 162. For example, in some embodiments, spacers 156a, 156b may include up to 98% of low-k layer 162 material. Therefore, low-k layer 162 may have a thickness t2 within spacer areas 150a, 150b that is, for example, approximately 1-49 nm. In the embodiment where spacer layer 154 is removed (not shown), low-k layer may have a thickness t2 equal to the depth dl of spacers 150a, 150b. In this embodiment, low-k layer may directly contact silicon layer 106. Low-k layer may have a total thickness t3 of, for example, approximately 1-100 nm and can even exceed approximately 100 nm if compatible with middle of the line integration. As shown in FIG. 7, this embodiment may also include dielectric layer 172 and contacts 174 formed thereon as previously described.

Figure 8:
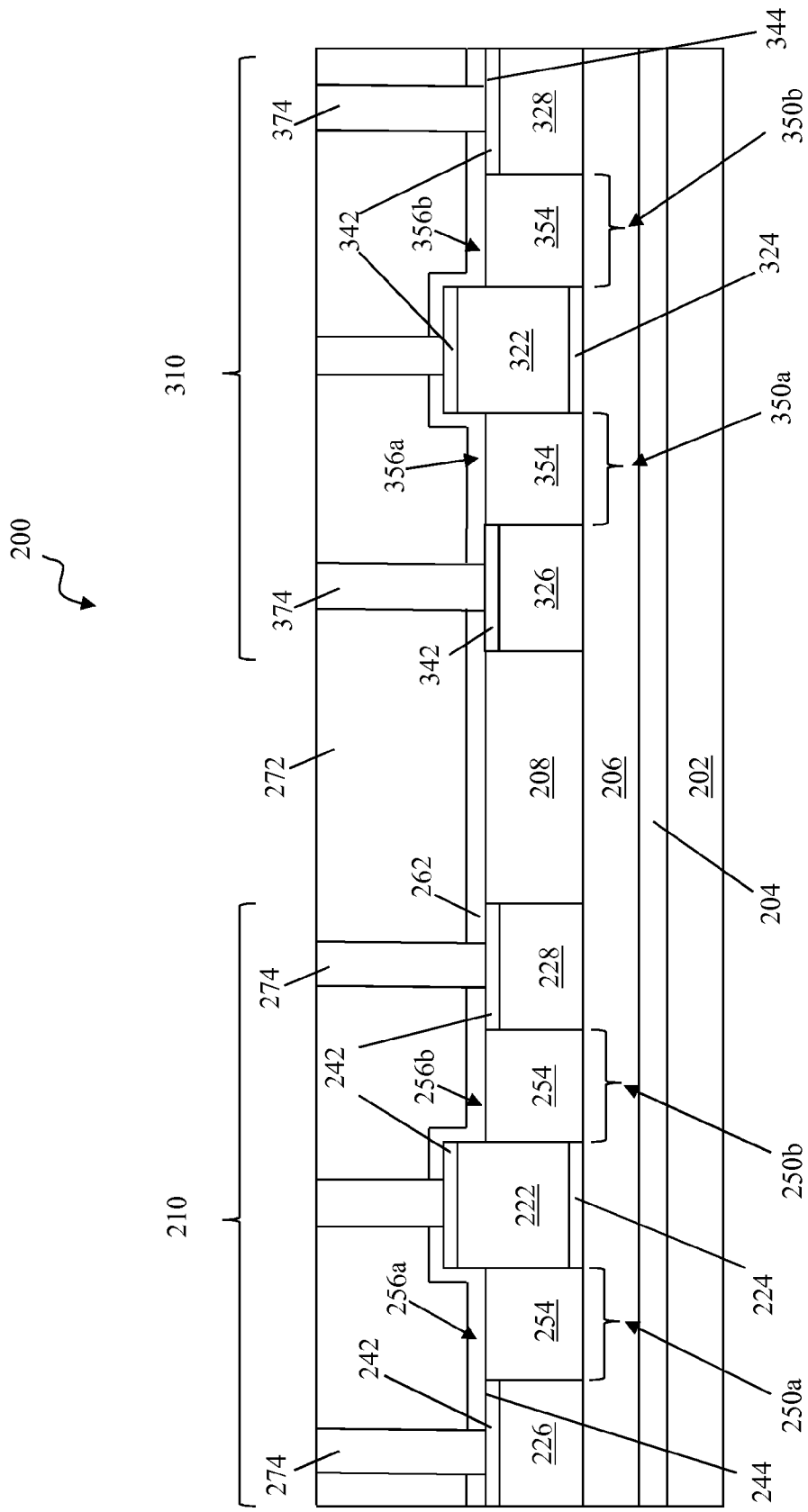
FIG. 8 shows a semiconductor device having a PFET region and a NFET region according to one aspect of the invention.
Figure 9:
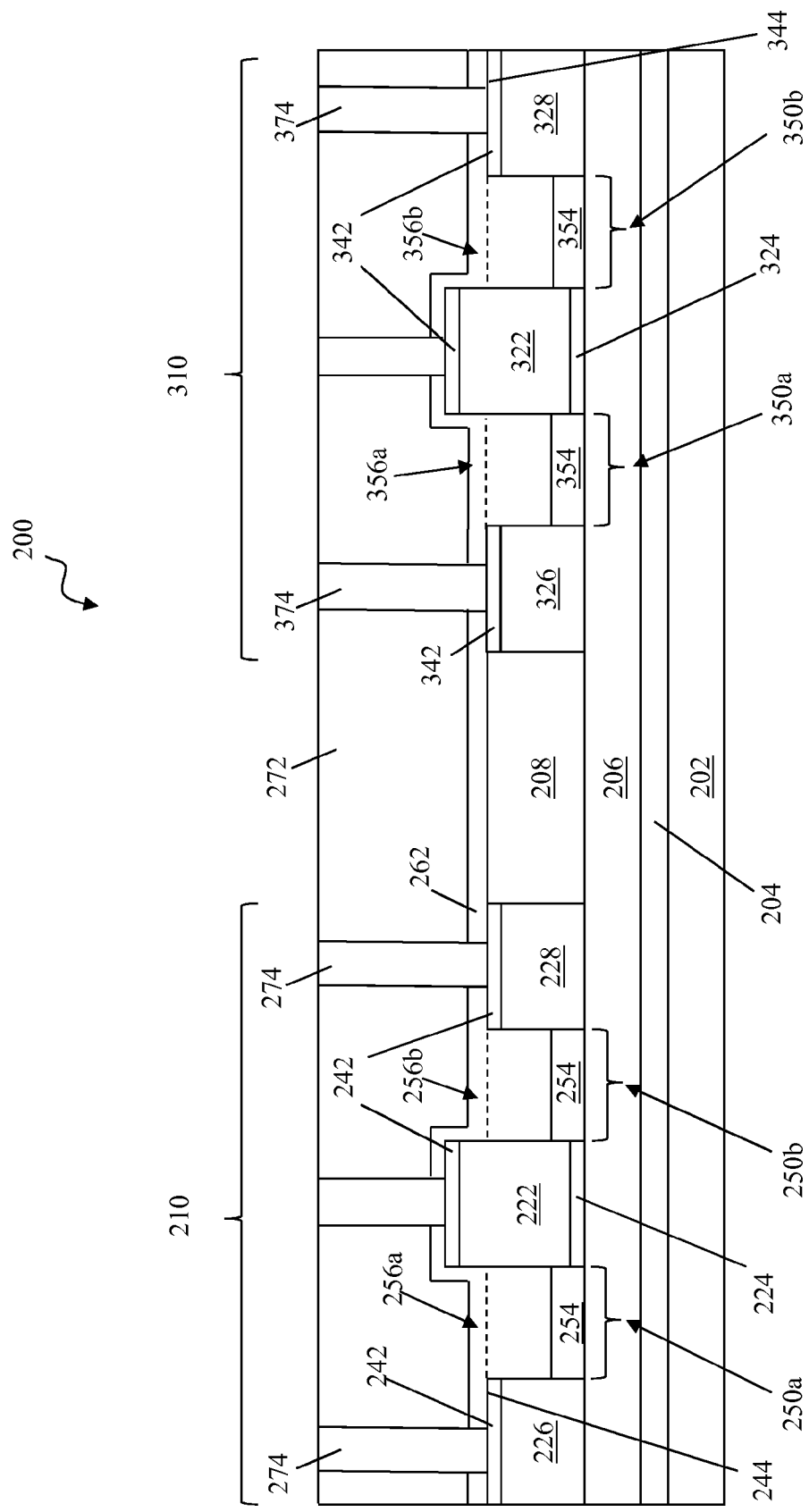
FIG. 9 shows a semiconductor device having a PFET region and a NFET region according to another aspect of the invention.

Referring now to FIGS. 8-9, another aspect of the invention provides for a semiconductor structure 200 which includes a p-type field effect transistor (PFET) 210 and a n-type field effect transistor (NFET) 310 as known in the art of semiconductor manufacturing. While FIGS. 8-9 show this embodiment as a FDSOI device, it is understood that the embodiments described herein are equally applicable to a PDSOI device as previously described with reference to FIGS. 1-7. It is also understood that any of the materials of like structures described with respect to the embodiments of FIGS. 1-7 may also be included with the corresponding structures of FIGS. 8-9 and have not been repeated herein for the purpose of clarity.

PFET 210 and NFET 310 may be formed via substantially similar fabrication processes as those previously described with respect to the previous embodiments. However, it is to be understood, that the embodiment of FIGS. 8-9 also requires that PFET 210 is protected from ion implantation during ion implants required only for NFET 310, and NFET 310 is protected from ion implantation during ion implants required only for PFET 210. Often this protection is provided by a photo resist layer. PFET 210 and NFET 310 may be separated by isolation region 208 as known in the art of semiconductor manufacturing. Isolation region 208 may include conventional isolation material such as an oxide based dielectric, e.g., silicon oxide. In this embodiment, semiconductor structure 200 includes a substrate 202, an insulating layer 204, and a silicon layer 206 as previously described with reference to FIGS. 1-7.

PFET 210 may include a first gate 222, a first raised source 226, and a first raised drain 228 on silicon layer 206. First gate 222 may be directly on silicon layer 206. In another embodiment, a gate dielectric 224 may substantially separate first gate 222 and silicon layer 206. First gate 222 may be positioned substantially between first raised source 122 and first raised drain 124. NFET 310 may include a second gate 322, a second raised source 326, and a second raised drain 328 on silicon layer 206. Second gate 322 may be directly on silicon layer 206. In another embodiment, a gate dielectric 324 may substantially separate first gate 322 and silicon layer 206. Second gate 322 may be positioned substantially between second raised source 326 and second raised drain 328. Additionally, silicide contacts 242, 342 may be positioned on each of the gates 222, 322, raised sources 226, 326, and raised drains 228, 328. First silicide contact 242 may be the same or different material as second silicide contact 342.

In this embodiment, a first spacer area 250a may substantially separate first raised source 226 from first gate 222, and a second spacer area 250b may substantially separate first raised drain 228 from first gate 222 in PFET 210. As previously described, spacers 256a, 256b may be formed in spacer areas 250a, 250b. Spacers 256a, 256b may include a first spacer layer 254. First spacer layer 254 may substantially fill first and second spacer areas 250a, 250b. That is, a substantial portion of spacers 256a, 256b may include first spacer layer 254. First spacer layer 254 may be in contact with silicon layer 206 and extend to top surface 244 of first silicide contact 242.

Additionally, a third spacer area 350a may substantially separate second raised source 326 and second gate 322, and a fourth spacer area 350b may substantially separate second raised drain 326 and second gate 322 in NFET 301. Spacers 356a, 356b may be formed in spacer areas 350a, 350b. Spacers 356a, 356b may include a second spacer layer 354. Second spacer layer 354 may substantially fill third and fourth spacer areas 350a, 350b. That is, a substantial portion of spacers 356a, 356b may include second spacer layer 354. Second spacer layer 354 may be in contact with silicon layer 206 and extend to top surface 344 of second silicide contact 342. Second spacer layer 354 may include the same or different material than first spacer layer 254. As previously described, spacer areas 250a, 250b, 350a, 350b may have a depth (dl as shown in FIGS. 1-7) that is, for example, approximately 1-50 nm.

Semiconductor structure 200 may further include a low-k layer 262 over silicide contact 242, 342 on gates 224, 324, raised sources 226, 326, and raised drains 228, 328. Low-k layer 262 may also be over spacer layers 254, 354 within spacer areas 250a, 250b, 350a, 350b. In another embodiment, low-k layer 162 may extend partially into spacer areas 250a, 250b, 350a, 350b as shown in FIG. 9. That is, in this embodiment, spacers 256a, 256b, 356a, 356b may include at least a portion of low-k layer 262. In some embodiments, spacers 256a, 256b, 356a, 356b may substantially include low-k layer 262. For example, spacers 256a, 256b, 356a, 356b may include up to 98% of low-k layer 262. In this embodiment, low-k layer 162 may extend into spacer areas 250a, 250b, 350a, 350b, for example, approximately 1-49 nm. That is, in some embodiments, low-k layer 262 remains in contact with spacer layers 254, 354 in spacer areas 250a, 250b, 350a, 350b. In other embodiments, spacer layers 254, 354 may be completely removed and low-k layer 162 may directly contact silicon layer 206 within spacer areas 250a, 250b, 350a, 350b such that thickness of low-k layer within each of the spacer areas 250a, 250b, 350a, 350b (t2 as shown in FIG. 7) may be equal to depth of spacer areas 250a, 250b, 350a, 305b (dl as shown in FIG. 1-7).

Referring to FIGS. 8-9 together, semiconductor structure 200 may also include a dielectric layer 272 positioned over low-k layer 262. It is to be understood that dielectric layer 272 as described herein may include contacts 274, 374 extend there through as known in the art of semiconductor manufacturing and previously described herein with reference to FIGS. 4 and 7.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A silicon-on-insulator device comprising:
   a silicon layer on an insulating layer on a substrate;
   a raised source and a raised drain on the silicon layer;
   a gate between the raised source and the raised drain;
   a set of silicide contacts having a first silicide contact on the raised source, a second silicide contact on the raised drain, and a third silicide contact on the gate;
   a first spacer separating the gate from the raised source and substantially covering a first sidewall of the gate;
   a second spacer separating the gate from the raised drain and substantially covering a second sidewall of the gate;
   a low-k layer covering at least an upper portion of each of the first sidewall and the second sidewall of the gate; and
   a dielectric layer over the low-k layer,
   wherein the low-k layer directly covers at least a portion of each of the first silicide contact, the second silicide contact, and the third silicide contact.

2. The semiconductor structure of claim 1, wherein each of the first spacer and the second spacer includes a spacer layer disposed over the silicon layer.

3. The semiconductor structure of claim 2, wherein the spacer layer includes nitride or oxide.

4. The semiconductor structure of claim 2, wherein a substantial portion of each of the first spacer and the second spacer is the spacer layer.

5. The semiconductor structure of claim 1, wherein at least an upper portion of each of the first spacer and the second spacer comprises a material that is the same as that of the low-k layer on top thereof.

6. The semiconductor structure of claim 1, wherein the first spacer extends from the silicon layer to a top surface of a first silicide contact on the raised source and the second spacer extends from the silicon layer to a top surface of a second silicide contact on the raised drain.

7. The semiconductor structure of claim 1, wherein the low-k layer has a dielectric constant of approximately less than 7.

8. The semiconductor structure of claim 1, wherein the low-k layer is selected from at least one of: SiBCN, SiOCN, SiCO, SiC, $SiO_2$ and an airgap.

9. The semiconductor structure of claim 1, further comprising a silicide contact on the gate.

10. The semiconductor structure of claim 1, further comprising a channel region in the silicon layer, the channel region having a first end in contact with a bottom surface of the raised source and a second end in contact with a bottom surface of the raised drain.

11. A fully-depleted silicon-on-insulator (FDSOI) device comprising:
    a silicon layer on an insulating layer on a substrate;
    a raised source and a raised drain on the silicon layer;
    a gate between the raised source and the raised drain, the gate being over the silicon layer and including a gate dielectric between the gate and the silicon layer;
    a set of silicide contacts having a first silicide contact on the raised source, a second silicide contact on the raised drain, and a third silicide contact on the gate;
    a pair of spacers having a first spacer separating the gate from the raised source and substantially covering a first sidewall of the gate, and a second spacer separating the gate from the raised drain and substantially covering a second sidewall of the gate, each of the spacers including:
        a spacer layer on the silicon layer, and
        a low-k layer on the spacer layer; and
    a dielectric layer over the low-k layer,
    wherein the low-k layer covers at least an upper portion of each of the first sidewall and second sidewall of the gate, and
    wherein the low-k layer directly covers at least a portion of each of the first silicide contact, the second silicide contact, and the third silicide contact.

12. The FDSOI device of claim 11, wherein the spacer layer includes nitride or oxide.

13. The FDSOI device of claim 11, wherein the low-k layer has a dielectric constant of approximately less than 7.

14. The FDSOI device of claim 11, wherein the first spacer extends from the silicon layer to a top surface of the first silicide contact on the raised source and the second spacer extends from the silicon layer to a top surface of the second silicide contact on the raised drain.

15. The FDSOI device of claim 11, wherein the low-k layer is selected from at least one of: SiBCN, SiOCN, SiCO, SiC, $SiO_2$ and an airgap.

16. The FDSOI device of claim 11, wherein at least an upper portion of the first spacer and the second spacer comprises a material that is the same as that of the low-k layer on top thereof.

17. A method for fabricating a semiconductor structure with a reduced parasitic capacitance, the method comprising:
    forming a semiconductor device including a raised source, a raised drain, a gate, and a pair of spacer areas having a spacer layer therein, the pair of spacer areas separating the gate from the raised source and the raised drain;
    forming silicide contacts on the raised source, the raised drain, and the gate:
    removing at least a portion of the spacer layer in each of the spacer areas;
    depositing a low-k layer such that the low-k layer covers at least an upper portion of a first sidewall of the gate and an upper portion of a second sidewall of the gate to reduce the parasitic capacitance of the semiconductor structure, and such that the low-k layer directly covers at least a portion of each of the first silicide contact, the second silicide contact, and the third silicide contact; and
    depositing a dielectric layer over the raised source, the raised drain, and the gate.

18. The method of claim 17, wherein the depositing the low-k layer includes depositing a material having a lower dielectric constant than a dielectric constant of the portion of the spacer layer that was removed.

19. The method of claim 17, wherein the depositing the low-k layer includes depositing the low-k layer such that at least an upper portion of each of the first spacer and the second spacer comprises a material that is the same as that of the low-k layer on top thereof.

20. The method of claim 17, wherein the forming the silicide contacts includes:
   depositing a metal;
   annealing the metal; and
   selectively etching the metal such that portions of the metal remain in contact with the raised source, the raised drain, and the gate.

* * * * *